(12) United States Patent
Funatsuki et al.

(10) Patent No.: US 9,305,637 B2
(45) Date of Patent: Apr. 5, 2016

(54) NONVOLATILE SEMICONDUCTOR MEMORY DEVICE

(71) Applicant: KABUSHIKI KAISHA TOSHIBA, Tokyo (JP)

(72) Inventors: Rieko Funatsuki, Kanagawa (JP); Takuya Futatsuyama, Kanagawa (JP); Fumitaka Arai, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 81 days.

(21) Appl. No.: 14/194,781

(22) Filed: Mar. 2, 2014

(65) Prior Publication Data
US 2015/0070989 A1 Mar. 12, 2015

(30) Foreign Application Priority Data
Sep. 9, 2013 (JP) .................................. 2013-186605

(51) Int. Cl.
| G11C 11/34 | (2006.01) |
| G11C 11/56 | (2006.01) |
| G11C 16/04 | (2006.01) |
| G11C 16/34 | (2006.01) |

(52) U.S. Cl.
CPC ........ *G11C 11/5628* (2013.01); *G11C 16/0483* (2013.01); *G11C 16/3431* (2013.01); *G11C 16/3459* (2013.01)

(58) Field of Classification Search
USPC ............. 365/185.03, 185.11, 185.12, 185.17, 365/185.18, 185.19, 185.22, 185.24, 365/185.29, 185.33
See application file for complete search history.

(56) References Cited

U.S. PATENT DOCUMENTS

| 6,721,208 | B2 * | 4/2004 | Jung et al. ................. 365/185.29 |
| 7,215,576 | B2 * | 5/2007 | Watanabe et al. ......... 365/185.22 |
| 7,230,853 | B2 * | 6/2007 | Kwon et al. .............. 365/185.22 |
| 7,266,019 | B2 * | 9/2007 | Taoka et al. .............. 365/185.29 |
| 7,492,641 | B2 |   2/2009 | Hosono et al. |
| 7,903,467 | B2 * | 3/2011 | Lee ........................... 365/185.22 |
| 7,929,351 | B2 * | 4/2011 | Seol et al. ................. 365/185.22 |
| 8,773,911 | B2 * | 7/2014 | Park ........................... 365/185.22 |
| 8,854,879 | B2 * | 10/2014 | Shim et al. ............... 365/185.03 |
| 9,082,493 | B2 * | 7/2015 | He et al. |
| 2012/0092931 | A1 |  4/2012 | Edahiro |

FOREIGN PATENT DOCUMENTS

| JP | 2004-030897 A | 1/2004 |
| JP | 2004-047094 A | 2/2004 |

(Continued)

OTHER PUBLICATIONS

Japanese Office Action dated Jan. 19, 2016 in counterpart Japanese Patent Application Serial No. 2013-186605.

*Primary Examiner* — Trong Phan
(74) *Attorney, Agent, or Firm* — Patterson & Sheridan, LLP

(57) ABSTRACT

A nonvolatile semiconductor memory device includes a memory cell array having nonvolatile memory cells in which one of multiple values is programmable therein by setting one of a plurality of threshold values therein and a control circuit that performs a writing operation on the memory cells. The writing operation performed by the control circuit includes a pre-programming verification operation to determine a threshold level of a memory cell in an erasure state, and a program operation in which a program voltage is selected from a plurality of program voltages on the basis of a determination result of the pre-programming verification operation.

16 Claims, 10 Drawing Sheets

(56) References Cited

FOREIGN PATENT DOCUMENTS

| | | |
|---|---|---|
| JP | 2005-353275 A | 12/2005 |
| JP | 2006-059532 A | 3/2006 |
| JP | 2009-151865 A | 7/2009 |
| JP | 2010-530594 A | 9/2010 |
| JP | 2011-165278 A | 8/2011 |
| JP | 2012069224 A | 4/2012 |
| JP | 2013-077362 A | 4/2013 |
| WO | 2006/105133 A1 | 10/2006 |
| WO | 2008/048810 A2 | 4/2008 |

* cited by examiner

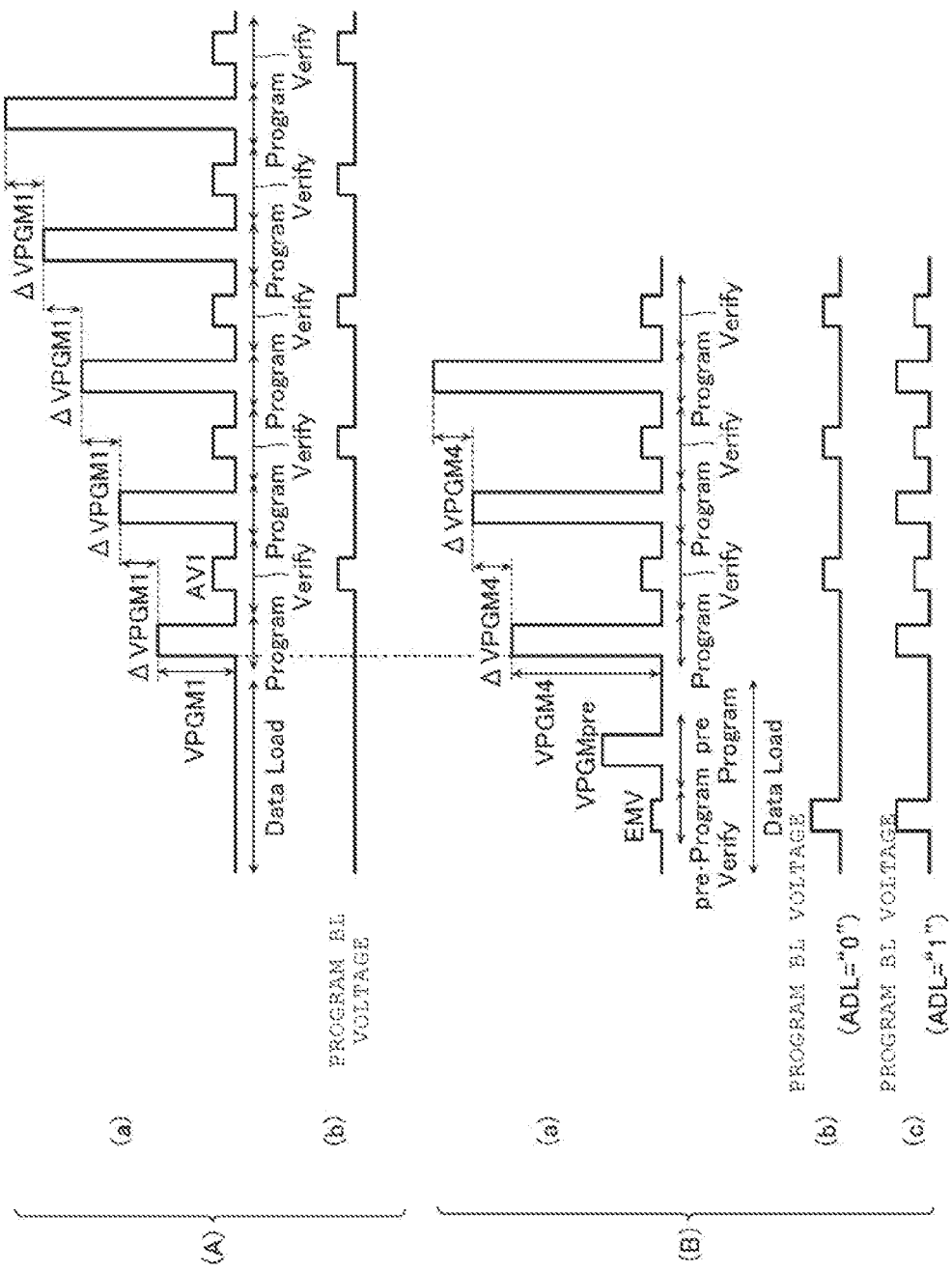

NONVOLATILE SEMICONDUCTOR MEMORY DEVICE

CROSS-REFERENCE TO RELATED APPLICATION

This application is based upon and claims the benefit of priority from Japanese Patent Application No. 2013-186605, filed Sep. 9, 2013, the entire contents of which are incorporated herein by reference.

FIELD

Embodiments described herein relate generally to a nonvolatile semiconductor memory device.

BACKGROUND

In a nonvolatile semiconductor memory device such as a NAND type flash memory, a memory cell has a control gate and a charge storage layer, and stores, as data, a magnitude of a threshold voltage which changes depending on an amount of electric charge stored in the charge storage layer. In this nonvolatile semiconductor memory device, there is a case where a characteristic difference occurs for each memory cell due to a variation or the like in a manufacturing process.

DESCRIPTION OF THE DRAWINGS

FIG. 11 is a diagram illustrating a writing operation of a nonvolatile semiconductor memory device according to a third embodiment.

DETAILED DESCRIPTION

Embodiments provide a nonvolatile semiconductor memory device capable of reducing a writing time by performing writing according to characteristics of a memory cell.

In general, according to one embodiment, a nonvolatile semiconductor memory device includes a memory cell array having nonvolatile memory cells in which one of multiple values is programmable therein by setting one of a plurality of threshold values therein and a control circuit that performs a writing operation. The writing operation performed by the control circuit includes a pre-programming verification operation to determine a threshold level of a memory cell in an erasure state, and a program operation in which a program voltage is selected from a plurality of program voltages on the basis of a determination result of the pre-programming verification operation.

Hereinafter, with reference to the drawings, a nonvolatile semiconductor memory device according to this disclosure will be described.

First Embodiment

Overall Configuration

Figure 1:
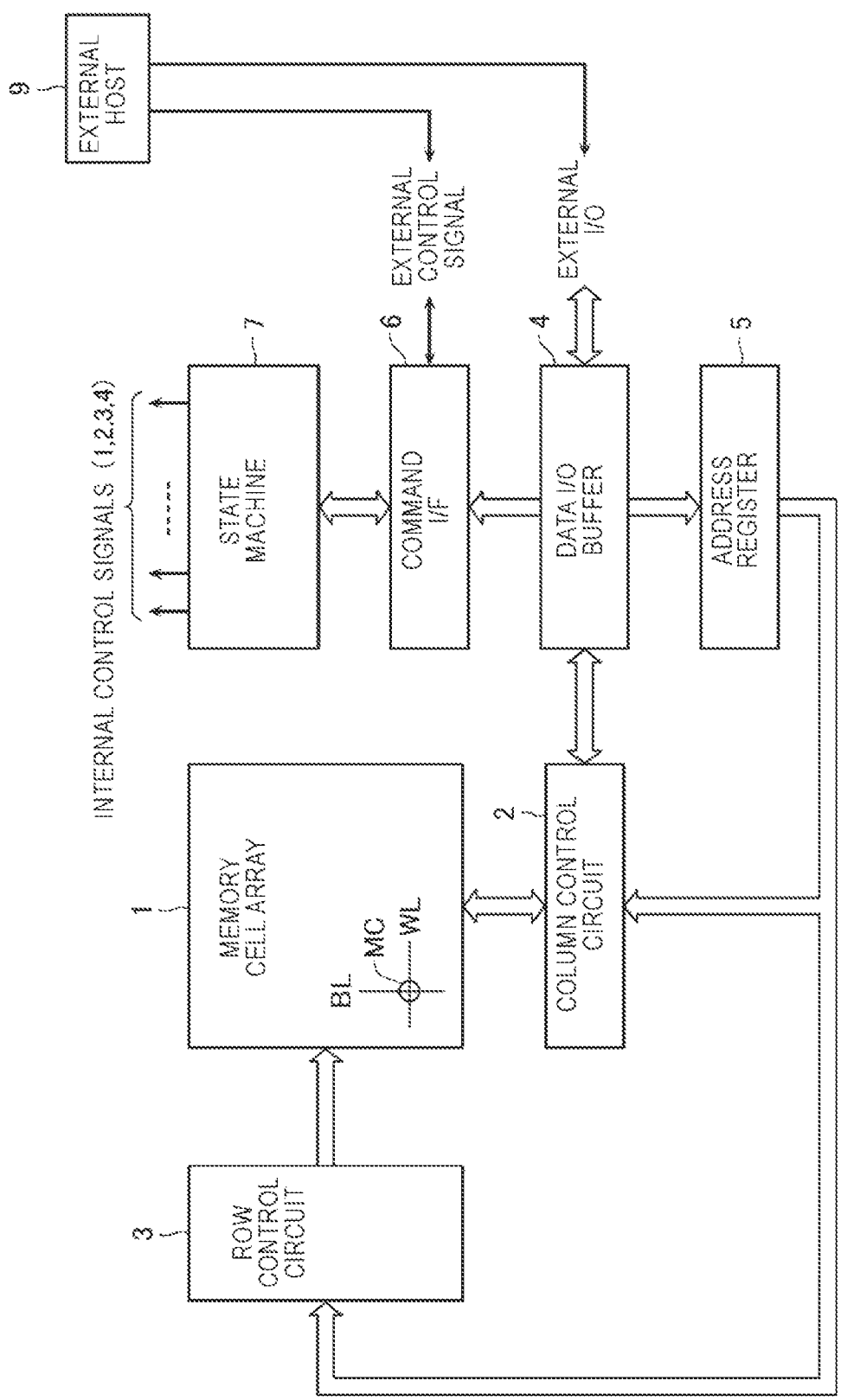
FIG. 1 is a block diagram illustrating a configuration of a nonvolatile semiconductor memory device according to a first embodiment.

FIG. 1 is a block diagram illustrating a configuration of a nonvolatile semiconductor memory device according to the first embodiment. The nonvolatile semiconductor memory device is a NAND type flash memory employing a quaternary storage method. The nonvolatile semiconductor memory device includes a memory cell array 1 in which memory cells MC storing data are disposed in a matrix. The memory cell array 1 includes a plurality of bit lines BL, a plurality of word lines WL, and a plurality of memory cells MC. The memory cells MC are disposed in a matrix at respective intersections of the bit lines BL and the word lines WL. Each of the memory cells MC has a stack gate structure including a floating gate electrode which is a charge storage layer storing electric charge, and a control gate electrode connected to each of the word lines WL, and can electrically rewrite data by injecting or emitting electric charge into or out of the floating gate electrode.

The memory cell array 1 is connected to a column control circuit 2 which controls voltages of the bit lines BL, and a row control circuit 3 which controls voltages of the word lines WL. The column control circuit 2 reads data of the memory cells MC of the memory cell array 1 via the bit lines BL. In addition, the column control circuit 2 applies a voltage to the memory cells MC of the memory cell array 1 via the bit lines BL so as to perform writing on the memory cells MC. The column control circuit 2 and the row control circuit 3 are an example of a control circuit which performs writing on the memory cell array 1.

The column control circuit 2 is connected to a data input and output buffer 4. Data of the memory cell MC read from the memory cell array 1 is output from a data input and output terminal (External I/O) to an external host 9 via the data input and output buffer 4. In addition, data to be written, which is input from the external host 9 to the data input and output terminal (External I/O), is input to the column control circuit 2 via the data input and output buffer 4 and is then written to a designated memory cell MC.

The data input and output buffer 4 is connected to an address register 5 and a command I/F 6. The address register 5 outputs address information which is input from the data input and output buffer 4, to the column control circuit 2 and the row control circuit 3. The command I/F 6 is connected to a state machine 7 and the external host 9, and performs transmission and reception of a control signal therebetween. The state machine 7 is connected to the memory cell array 1, the column control circuit 2, the row control circuit 3, and the data input and output buffer 4. The state machine 7 generates internal control signals (1, 2, 3, 4) for controlling the memory cell array 1, the column control circuit 2, the row control circuit 3, and the data input and output buffer 4, in response to an external control signal which is input via the command I/F 6.

Figure 2:
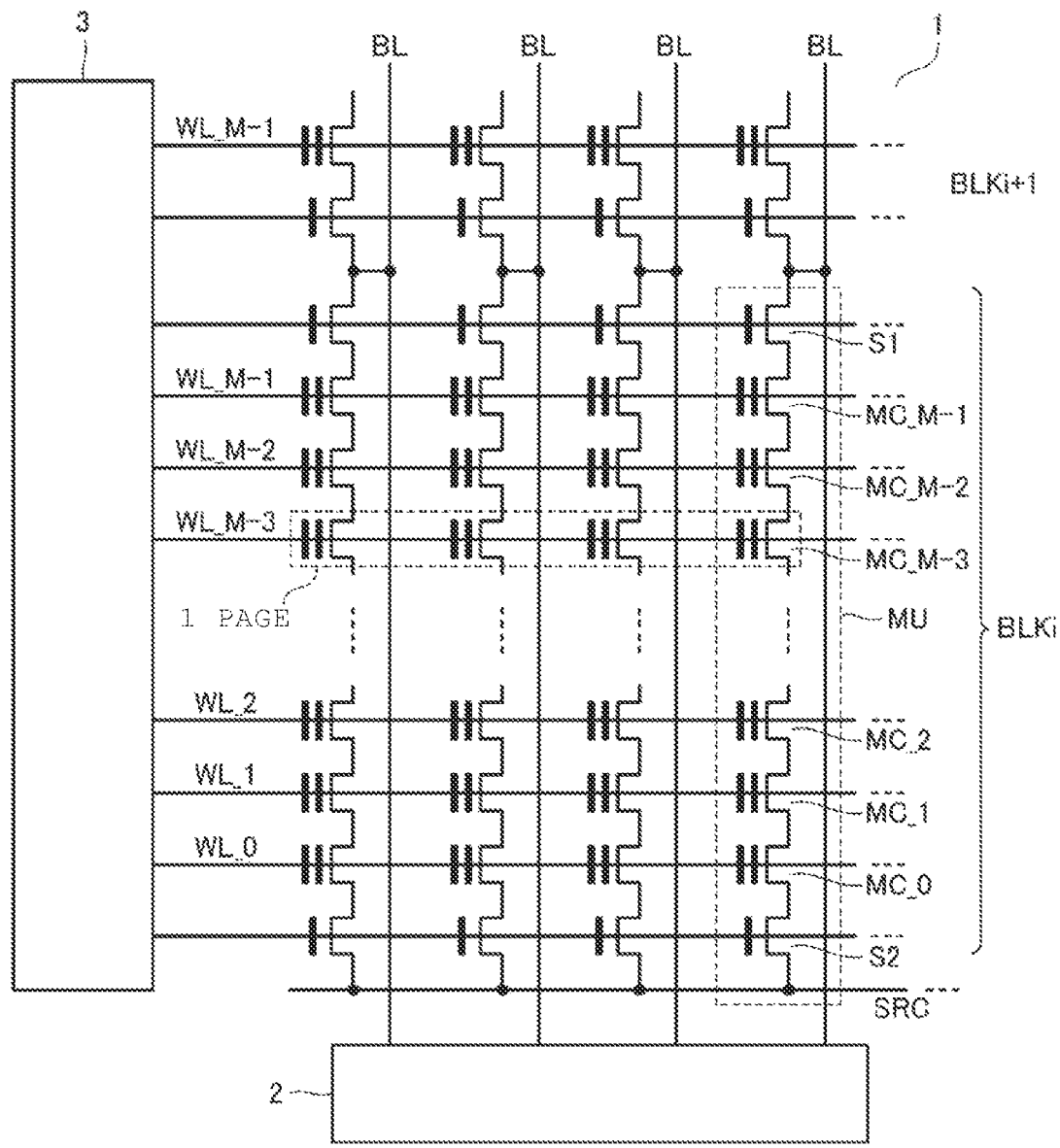
FIG. 2 is a circuit diagram illustrating a configuration of a part of a memory cell array of the nonvolatile semiconductor memory device.

FIG. 2 is a circuit diagram illustrating a configuration of a part of the memory cell array 1 illustrated in FIG. 1. The memory cell array 1 includes a plurality of memory units MU. Each of the memory units MU includes M (where, for example, M=16) memory cells MC_0 to MC_M−1 which are connected in series, and a first selection gate transistor S1 and a second selection gate transistor S2 which are connected to both ends thereof. One end of the first selection gate transistor S1 is connected to the bit line BL, and one end of the second selection gate transistor S2 is connected to a source line SRC. The control gate electrodes of the memory cells MC_0 to MC_M−1 are respectively connected to the word lines WL_0 to WL_M−1. The memory units MU are disposed in plurality in the direction in which the word lines WL are formed, so as to form a single block, e.g., BLKi or BLKi+1. In the memory cell array 1, data is erased in the unit of the block BLK. In addition, a plurality of memory cells MC which are connected in common to a single word line WL form one page. In the memory cell array 1, data is written and read in the unit of one page.

Data Storage Method

Figure 3:
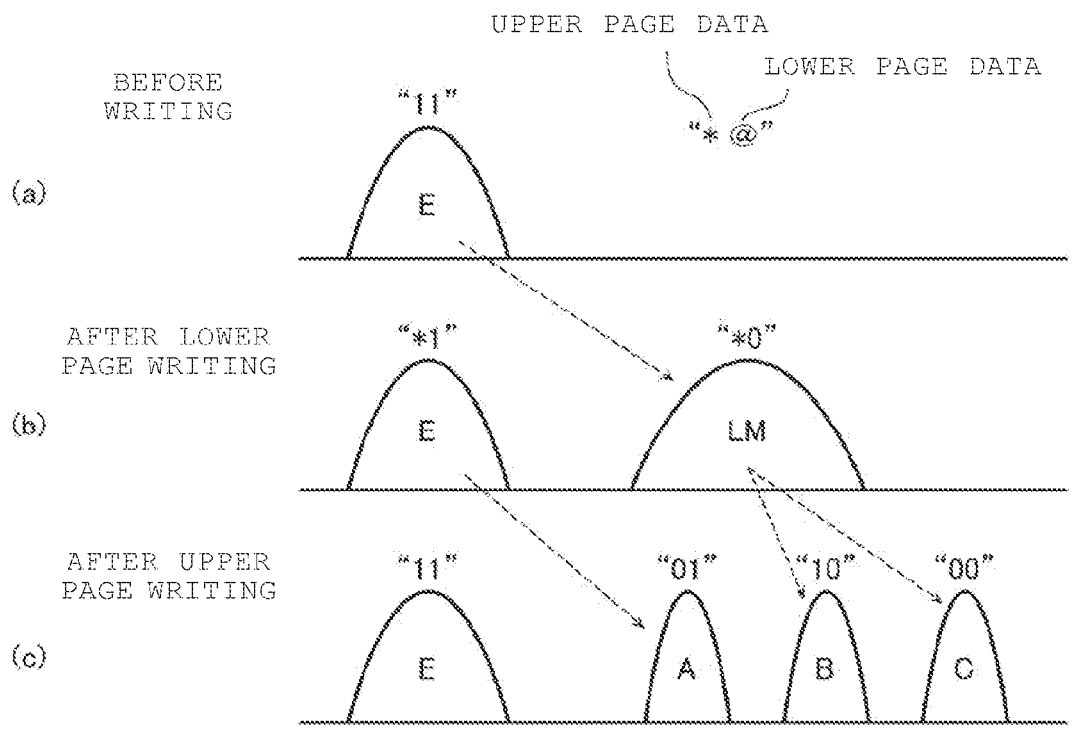
FIG. 3 is a diagram illustrating a threshold distribution of each memory cell of the memory cell array.

Next, a description will be made of an outline of a data storage method of the nonvolatile semiconductor memory device. The nonvolatile semiconductor memory device is configured so that a threshold voltage of the memory cell MC has a four-way distribution. FIGS. 3(a) to 3(c) are diagrams illustrating a relationship between a change in a threshold voltage distribution of the memory cell MC and 2-bit quaternary data (data "11", "01", "10", and "00") stored in the memory cell MC when data is written in the nonvolatile semiconductor memory device.

FIG. 3(a) is a diagram illustrating a threshold voltage distribution E of the memory cell MC after block erasure is performed and before writing. After lower page writing (Lower Page Program) is performed, a threshold voltage of a cell in which writing is completed increases among the memory cells MC with the threshold voltage distribution E, and this leads to transition to a threshold voltage distribution LM (shown in FIG. 3(b)). In addition, after upper page writing (Upper Page Program) is performed, the two threshold voltage distributions E and LM transition to four threshold voltage distributions E, A, B and C (shown in FIG. 3(c)). These threshold voltage distributions respectively correspond to data "11", "01", "10" and "00". In other words, 2-bit data of a single memory cell MC is formed by lower page data and upper page data. When data is denoted by "*@" herein, "*" indicates upper page data, and "@" indicates lower page data.

Writing Operation

Next, a description will be made of an outline of a writing operation in the present embodiment. In the present embodiment, lower page data and upper page data are written to the memory cell MC through different data writing processes, that is, two data writing processes.

Figure 4A:
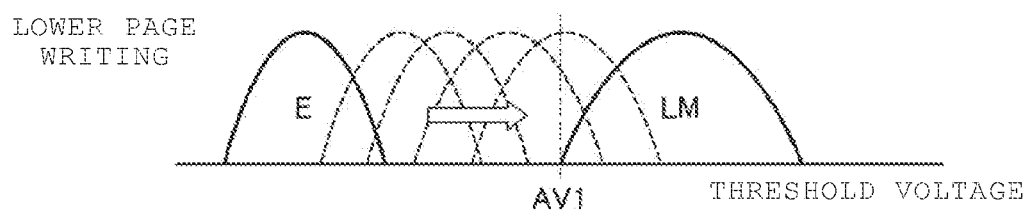
FIGS. 4A and 4B are diagrams illustrating a writing procedure of lower page data of the nonvolatile semiconductor memory device.
Figure 4B:
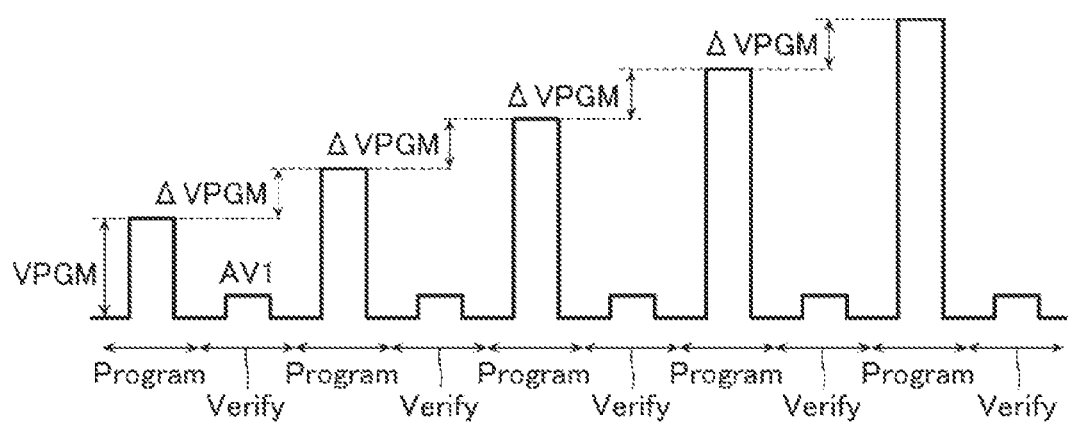

FIGS. 4A and 4B are diagrams illustrating writing of lower page data. FIG. 4A illustrates a threshold voltage distribution of the memory cell MC, and FIG. 4B illustrates transition of a program voltage applied to the word line WL. As illustrated in FIG. 4A, the memory cell MC in an erasure state shows a threshold voltage distribution E and stores data "11". If a program voltage is applied thereto multiple times, the threshold voltage distribution increases in stages, and finally reaches a threshold voltage distribution LM. At this time, a voltage which is the lowest in the threshold voltage distribution LM is a writing verification voltage AV1 for determining completion of the writing.

As illustrated in FIG. 4B, in the writing operation, a program voltage VPGM and the verification voltage AV1 are alternately applied to the word line (depicted below the horizontal axis shown in FIG. 4B alternately as "Program" and "Verify"), and the writing is completed when verification is passed. If the verification is not passed, and thus writing is not completed, in the next writing, a voltage which is higher than the previous program voltage by $\Delta$VPGM is applied. As above, an applied program voltage is gradually increased.

There is a case where a difference in characteristics (for example, an extent of an increase in a threshold voltage) for each memory cell MC occurs due to a variation in a manufacturing process. In this case, if a uniform program voltage (VPGM and $\Delta$VPGM) as illustrated in FIG. 4B is used in all the memory cells MC, time required to write data may increase. Therefore, in the following embodiment, a description will be made of a configuration of the nonvolatile semiconductor memory device capable of reducing a writing time in consideration of characteristics of the memory cell MC.

Figure 5:
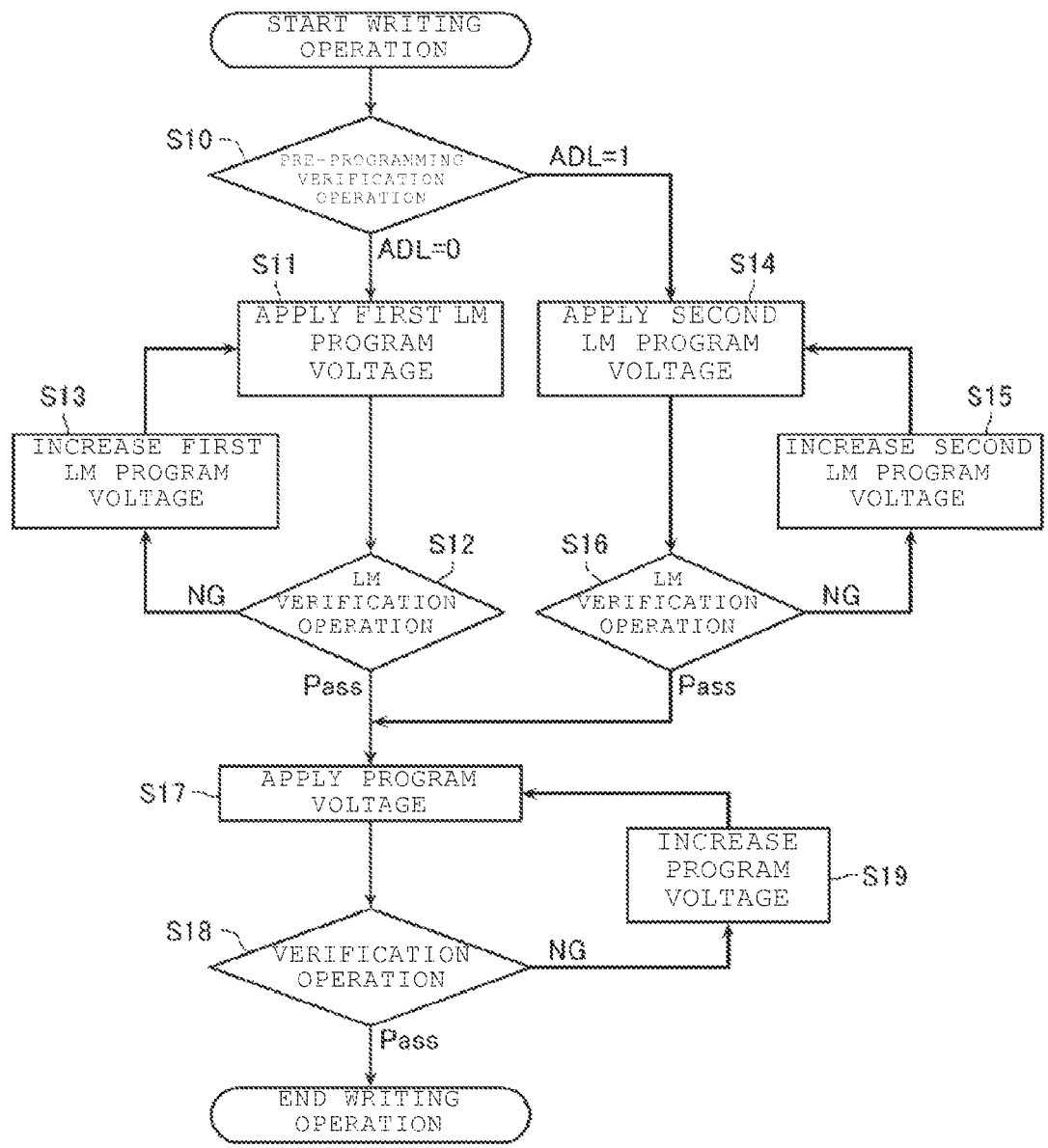
FIG. 5 is a flowchart illustrating a writing operation of the nonvolatile semiconductor memory device.

FIG. 5 is a flowchart illustrating a data writing operation of the nonvolatile semiconductor memory device according to the present embodiment. First, a pre-programming verification operation is performed on pages of the memory cell array 1 in an erasure state (S10). Here, the pre-programming verification operation is an operation for discriminating a memory cell of which an erasure level is low (i.e., a threshold voltage is high) from a memory cell of which an erasure level is high (i.e., a threshold voltage is low) among the memory cells MC with the threshold voltage distribution E in an erasure state. A verification voltage EMV which is a reference value of the pre-programming verification may be set to any value between a maximum value and a minimum value of the threshold voltage distribution E in an erasure state (see FIG. 10(a)). In the present embodiment, a memory cell of which a threshold voltage is higher than the reference value is indicated by ADL=0, and a memory cell of which a threshold voltage is lower than the reference value is indicated by ADL=1.

If a threshold voltage is higher than the reference value (ADL=0) in the pre-programming verification, a first program voltage is applied to the corresponding memory cell (S11). Successively, an LM verification operation is performed (S12), and if the verification is not passed (NG), the first program voltage is increased (S13), and the program voltage is applied again (S11). If the verification is passed (Pass), the flow proceeds to an upper page writing operation (S17 and subsequent steps).

If the threshold voltage is lower than the reference value (ADL=1) in the pre-programming verification, a second program voltage is applied to the corresponding memory cell (S14). Successively, an LM verification operation is performed (S15), and if the verification is not passed (NG), the second program voltage is increased (S16), and the program voltage is applied again (S14). If the verification is passed (Pass), the flow proceeds to the upper page writing operation (S17 and subsequent steps).

Here, it is recognized that one of the characteristics of the memory cell MC is a tendency that data is easily written to a cell from which data is easily erased. Therefore, preferably, a relatively low program voltage is applied to the memory cell MC with a low erasure level (a high threshold voltage), and a relatively high program voltage is applied to the memory cell MC with a high erasure level (a low threshold voltage). In the present embodiment, the second program voltage is set to be lower than the first program voltage.

Next, upper page data writing (S17 to S19) is performed. Also in the upper page writing operation, in the same manner as the lower page writing operation, first, a program voltage is applied (S17), and then a verification operation is performed (S18). If the verification is not passed, a program voltage is increased (S19), and writing is performed again (S17). If the verification is passed in step S18, the writing operation finishes.

Figure 6A:
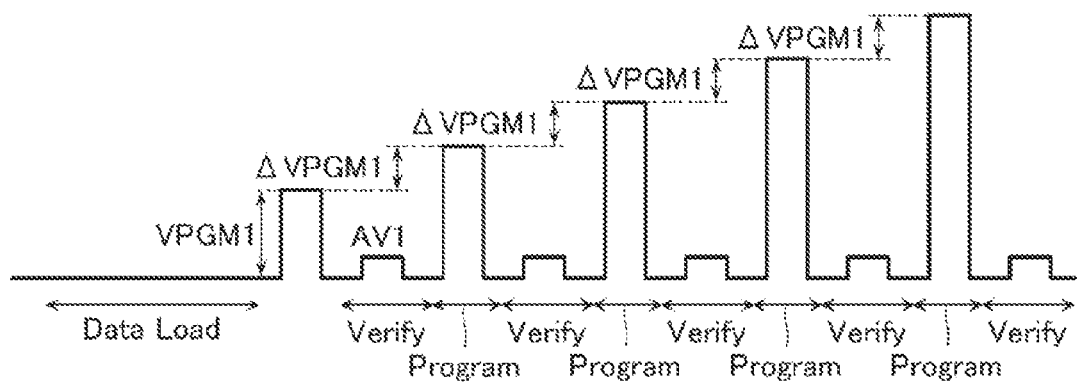
FIGS. 6A and 6B are diagrams illustrating applied voltages during the writing operation of the nonvolatile semiconductor memory device.
Figure 6B:
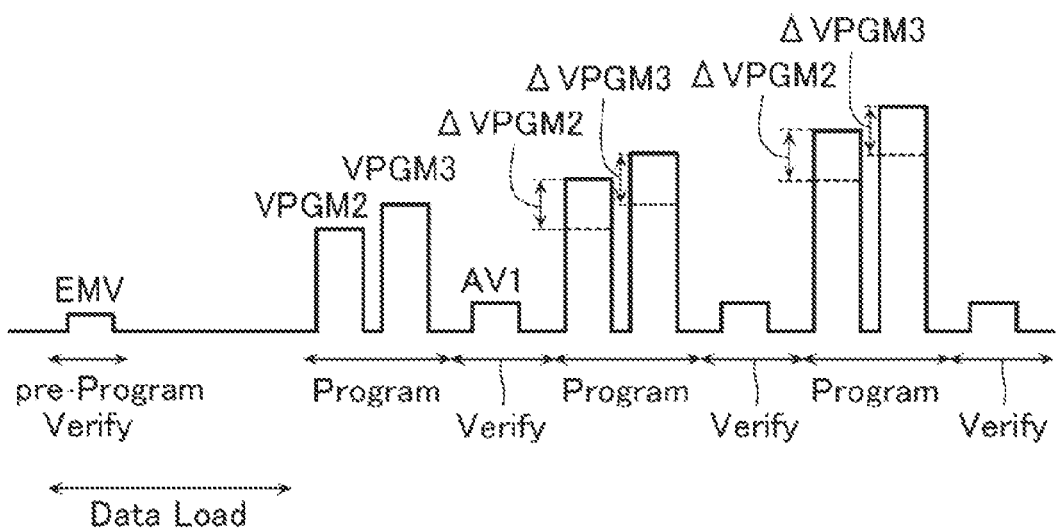

FIGS. 6A and 6B are diagrams illustrating a voltage applied to the word line WL during a writing operation, which includes alternating program and verification operations (depicted below the horizontal axes shown in FIGS. 6A and 6B alternately as "Program" and "Verify"). FIG. 6A illustrates a comparative form when there is one kind of program voltage, and FIG. 6B illustrates the present embodiment where a pre-programming verification operation ("pre-Program Verify") is carried out at the start of the writing operation. Whereas one kind of program voltage (VPGM1 and ΔVPGM) is applied during writing in FIG. 6A, two kinds of program voltages (VPGM2 and ΔVPGM, and VPGM3 and ΔVPGM) are consecutively applied during writing in FIG. 6B. A relationship between the two kinds of voltages is VPGM2<VPGM3.

In the present embodiment, a first program voltage VPGM3 which is a relatively high program voltage is used in the memory cell MC to which data is hard to write (where a threshold voltage is high), and a second program voltage VPGM2 which is a relatively low program voltage is used in the memory cell MC to which data is easily written (where a threshold voltage is low). Accordingly, an appropriate program voltage corresponding to characteristics of each memory cell MC can be applied, and thus the number of loops of writing can be reduced. In addition, an adjacent cell in which writing is in progress is suppressed from interfering with a cell in which writing is completed. As a result, a data writing time can be reduced.

In addition, as a writing method for the memory cell MC with a high threshold voltage, only the first program voltage VPGM3 may be applied, or the second program voltage VPGM2 and the first program voltage VPGM3 may be consecutively applied.

As described above, in the nonvolatile semiconductor memory device according to the present embodiment, one program voltage is selected among a plurality of program voltages on the basis of a result of pre-programming verification, and thus writing according to the characteristics of a memory cell is performed, thereby reducing a writing time.

In addition, in the nonvolatile semiconductor memory device according to the present embodiment, as illustrated in FIG. 6B, pre-programming verification is performed during a data load period (Data Load). Accordingly, as compared with the comparative form of FIG. 6A, a demerit (for example, extension of a writing time) due to the pre-programming verification is prevented.

Figure 7:
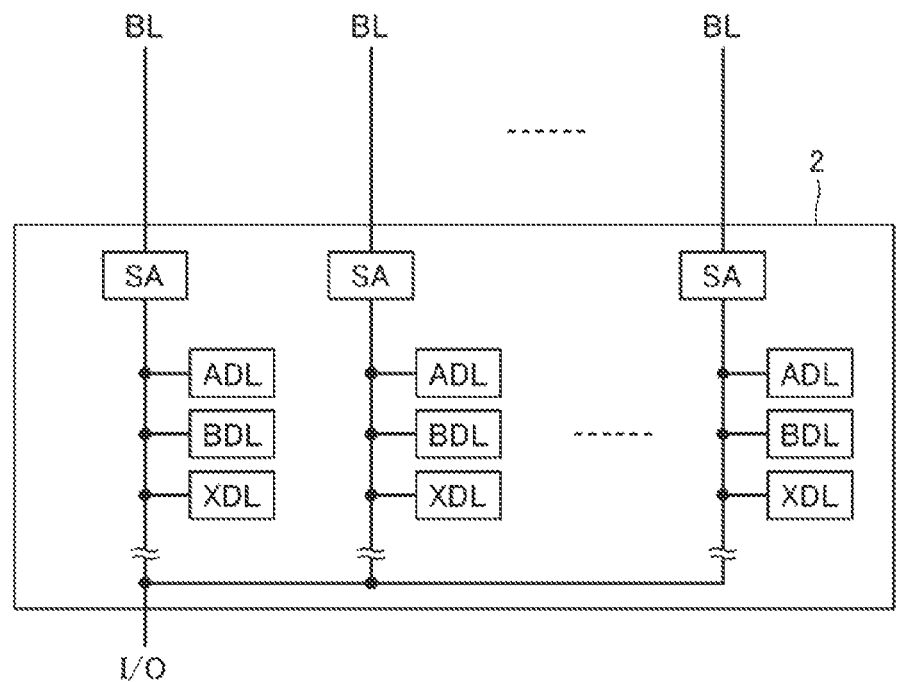
FIG. 7 is a diagram illustrating a configuration of a part of a column control circuit of the nonvolatile semiconductor memory device.

FIG. 7 is a diagram illustrating a part of an internal configuration of the column control circuit 2. A sense amplifier SA is connected to each bit line BL which extends from the memory cell array 1. A rear end of the sense amplifier SA is connected to a plurality of latch circuits (ADL, BDL, and XDL). Further, a rear end of each of the latch circuits is connected to the external input and output terminal (I/O) via the data input and output buffer 4.

Among the above-described latch circuits, the latch circuit ADL is used to temporarily preserve data during pre-programming verification in the present embodiment. As described above, ADL=0 indicates a memory cell of which a threshold voltage is higher than a reference value, and ADL=1 indicates a memory cell of which a threshold voltage is lower than the reference value. In addition, the other latch circuits BDL and XDL are used to preserve data to be written which is input from the data input and output terminal (external input and output (I/O)) during the period of data loading which is performed along with the pre-programming verification. Each latch can preserve 1-bit data, and 2-bit data corresponding to a total of an upper page and a lower page can be preserved by the latch circuits BDL and XDL.

As described above, in the nonvolatile semiconductor memory device according to the present embodiment, the first latch circuit (ADL) which preserves data read from the memory cell MC in the pre-programming verification operation and the second latch circuits (BDL and XDL) which preserve data which is input to the column control circuit 2 from an external device are provided, and thus the pre-programming verification operation can be performed along with data loading.

Second Embodiment

In the second embodiment, a description will be made of an example of performing pre-programming on a memory cell on the basis of a result of pre-programming verification.

Figure 8:
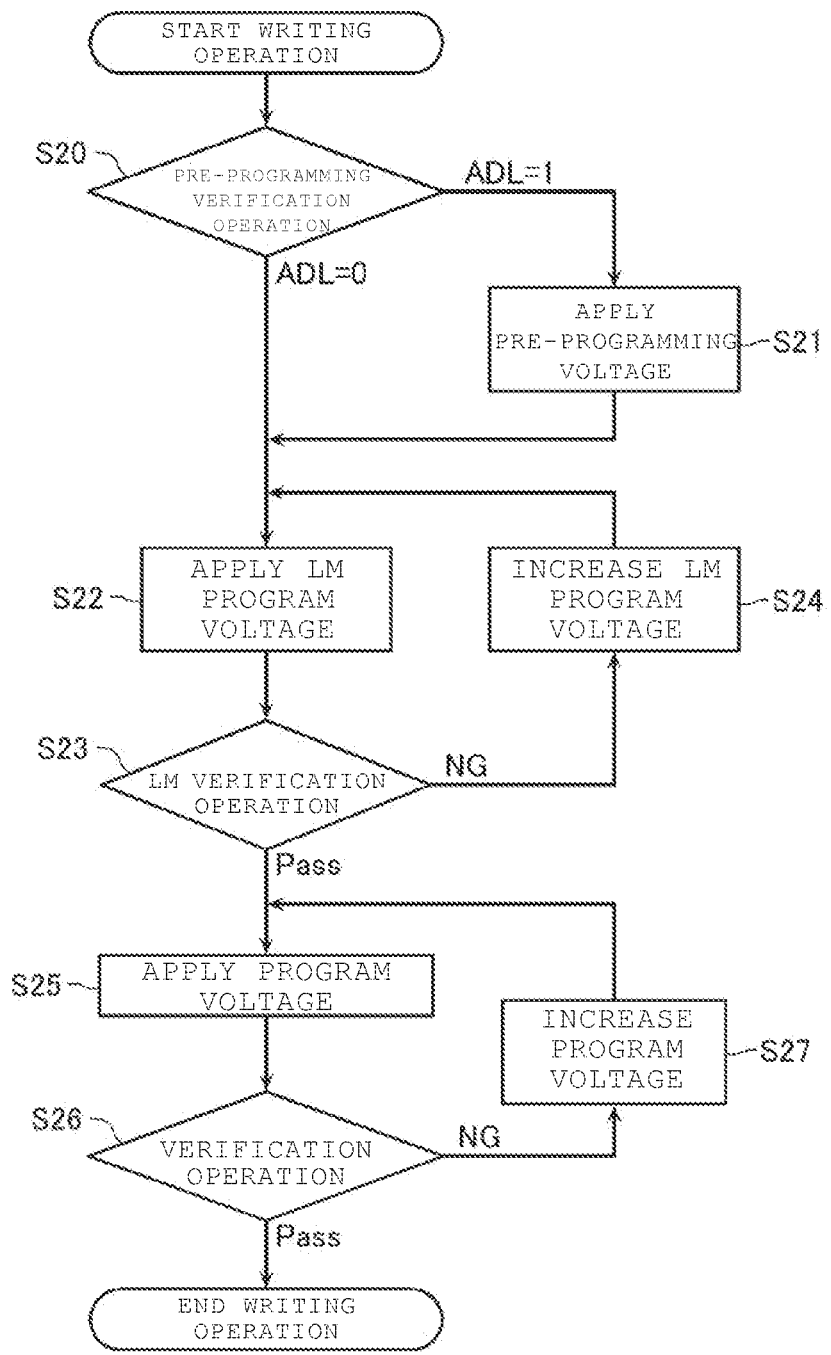
FIG. 8 is a flowchart illustrating a writing operation of a nonvolatile semiconductor memory device according to a second embodiment.

FIG. 8 is a flowchart illustrating a data writing operation of a nonvolatile semiconductor memory device according to the present embodiment. First, a pre-programming verification operation is performed on pages of the memory cell array 1 in an erasure state (S20). This pre-programming verification operation is the same as described in the first embodiment, and detailed description thereof will be omitted.

If a threshold voltage is lower than the reference value (ADL=1) in the pre-programming verification, a pre-programming voltage is applied to the corresponding memory cell MC (S21). Details of the pre-programming voltage will be described later. In addition, after the pre-programming voltage is applied, verification is not performed.

If a threshold voltage is higher than the reference value (ADL=0) in the pre-programming verification, or the application of the pre-programming voltage in S21 is completed, a lower page writing operation (writing-verification-rewriting) illustrated in S22 to S24 is performed. In the present embodiment, an example in which one kind of program voltage of a lower page is used is described, but a plurality of kinds of program voltages may be used according to a result of pre-programming verification in the same manner as in the first embodiment (see S10 to S16 of FIG. 5).

Successively, as illustrated in S25 to S27, an upper page writing operation (writing-verification-rewriting) is performed. The operation is the same as described in the first embodiment, and detailed description thereof will be omitted (see S17 to S19 of FIG. 5).

Figure 9:
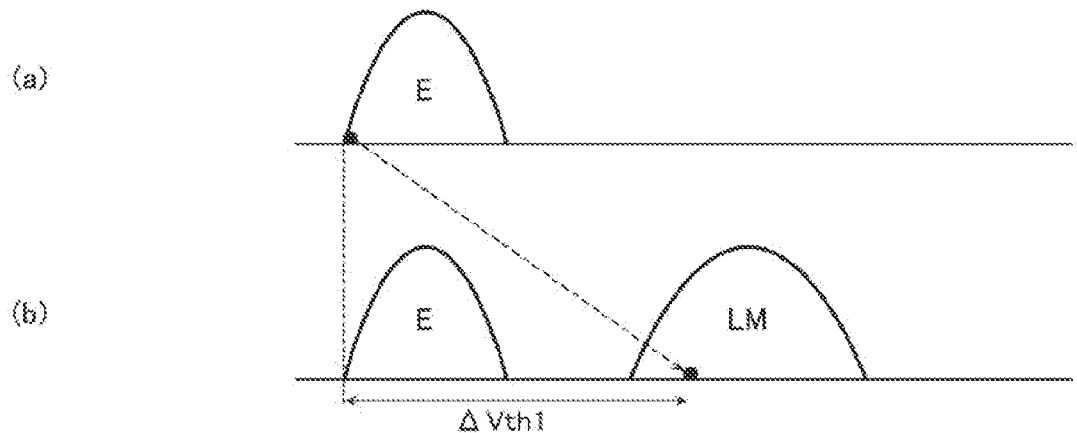
FIG. 9 is a diagram illustrating a threshold distribution of each memory cell of a nonvolatile semiconductor memory device according to a comparative example.
Figure 10:
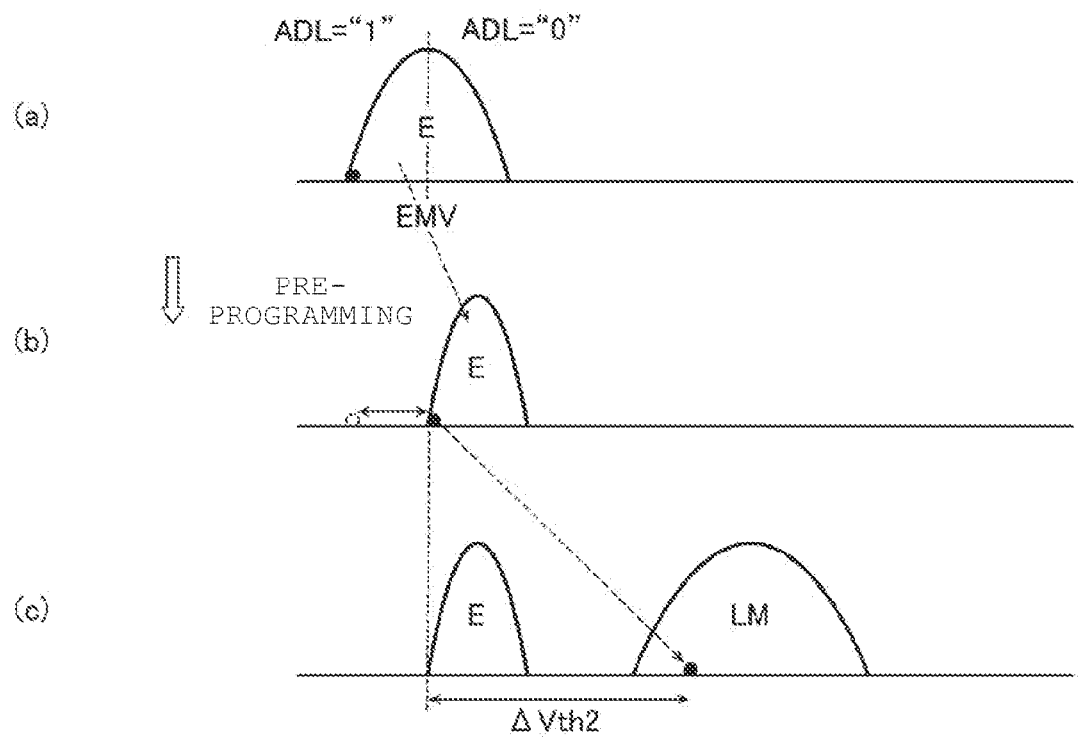
FIG. 10 is a diagram illustrating a threshold distribution of each memory cell of the nonvolatile semiconductor memory device according to the second embodiment.

FIGS. 9 and 10 are diagrams used to describe the pre-programming, and illustrate a threshold voltage distribution in the memory cell MC. FIG. 9 illustrates a comparative form in which the pre-programming is not performed, and FIG. 10 illustrates the present embodiment in which the pre-programming is performed. As illustrated in FIG. 9($a$) and FIG. 9($b$), if the pre-programming is not performed, a memory cell MC having the lowest threshold voltage in the threshold voltage distribution E in an erasure state requires a threshold variation ΔVth1 up to completion of writing.

In contrast, in FIG. 10($a$), the memory cell MC with the threshold voltage distribution E may be divided into two groups centering on the pre-programming verification voltage EMV through the pre-programming verification. Of the memory cells MC, pre-programming is performed on the memory cell MC with ADL=1 in which a threshold value is lower than a reference value, and thus the threshold voltage distribution E changes from FIG. 10(a) to FIG. 10(b). In this state, a threshold variation which is required for the memory cell MC with the lowest threshold voltage to reach writing completion is ΔVth2 smaller than ΔVth1 of FIG. 9. Accordingly, the number of loops of "writing voltage application-verification" required to reach writing completion can be reduced.

As described above, in the nonvolatile semiconductor memory device according to the present embodiment, pre-programming for increasing a threshold level is performed on a memory cell which is determined as a threshold level being smaller than a reference value as a result of pre-programming verification. Among memory cells which are in an erasure state, a threshold voltage of a memory cell with a large erasure level is increased in advance, and thus a writing time can be reduced.

Third Embodiment

In the third embodiment, a description will be made of an example of generating two kinds of program voltages by changing a voltage of the bit line.

FIG. 11 is a diagram illustrating changes in voltages of the word line WL and the bit line BL during a writing operation, which includes alternating program and verification operations (depicted below the horizontal axes of the two graphs of FIG. 11(A)(a) and FIG. 11(B)(a) alternately as "Program" and "Verify") of a nonvolatile semiconductor memory device according to the third embodiment. FIGS. 11(A)(a) and 11(A)(b) illustrate a comparative form, and FIGS. 11(B)(a) to 11(B)(c) illustrate the present embodiment where a pre-programming verification operation ("pre-Program Verify") and a pre-programming operation ("pre-Program") are carried out at the start of the writing operation. As illustrated in FIG. 11(A)(a), in the comparative form, VPGM1 (ΔVPGM1) is used as a program voltage which is applied to the word line WL. In addition, as illustrated in FIG. 11(A)(b), when the application of the program voltage VPGM to the word line WL is in progress, a program BL voltage with a low level, VSS, is applied to the bit line BL.

In contrast, in the present embodiment, as illustrated in FIG. 11(B)(a), VPGMpre is used as a pre-program voltage and VPGM4 (ΔVPGM4) is used as a program voltage applied to the word line WL. In addition, as illustrated in FIG. 11(B)(b), among the memory cells MC in an erasure state, a program BL voltage with a low level, VSS, is applied to the bit line BL connected to a cell with a high threshold voltage (ADL=0). Further, as illustrated in FIG. 11(B)(c), among the memory cells MC in an erasure state, a program BL voltage with an intermediate level, VBL, is applied to the bit line BL connected to a cell with a low threshold voltage (ADL=1) (VSS<VBL<VDD). Furthermore, although not illustrated, a bit line connected to a memory cell MC which is not a writing target is charged to a high level (VDD), and thus a program voltage is not substantially applied thereto.

As a result, a relatively high program voltage corresponding to a difference between VPGM4 and VSS is applied to the memory cell MC with a high threshold voltage, and a relatively low program voltage corresponding to a difference between VPGM4 and VBL is applied to the memory cell MC with a low threshold voltage. Accordingly, in the same manner as in the first embodiment, an appropriate program voltage can be selected among a plurality of program voltages according to an erasure level of the memory cell MC.

As above, in the nonvolatile semiconductor memory device according to the present embodiment, one program voltage can be selected among a plurality of program voltages by changing a voltage applied to the bit line BL. As a result, in the same manner as in the first embodiment, writing corresponding to characteristics of a memory cell is performed, and thus a writing time can be reduced.

Although, in the first to third embodiments, a NAND type memory cell which can store 2-bit data is described as an example, the configurations according to the present embodiments are applicable to memory cells which can store other bit numbers in the same manner.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
a memory cell array having nonvolatile memory cells in which one of multiple values is programmable therein by setting one of a plurality of threshold values therein; and
a control circuit configured to perform a writing operation on the memory cells of the memory cell array,
wherein the writing operation performed on a memory cell in an erasure state includes a pre-programming verification operation to determine a threshold level of the memory cell in the erasure state and a program operation in which a program voltage for the memory cell is selected from a plurality of program voltages based on a determination result of the pre-programming verification operation, wherein
the control circuit selects and writes a first program voltage to a memory cell which is determined to have a threshold level larger than a reference value in the pre-programming verification operation, and selects and writes a second program voltage lower than the first program voltage to a memory cell which is determined to have a threshold level smaller than the reference value in the pre-programming verification operation.

2. The nonvolatile semiconductor memory device according to claim 1, wherein
the control circuit performs the pre-programming verification operation while loading data into the control circuit from an external device.

3. The nonvolatile semiconductor memory device according to claim 2, wherein
the control circuit includes a first latch circuit and a second latch circuit, and
the first latch circuit holds data read from the memory cell in the pre-programming verification operation, and the second latch circuit holds data which is loaded into the control circuit from the external device.

4. The nonvolatile semiconductor memory device according to claim 1, wherein
each memory cell is connected to between a word line and a bit line, and
the control circuit selects a voltage applied to a bit line connected to a memory cell based on the determination result of the pre-programming verification operation performed on the memory cell.

5. The nonvolatile semiconductor memory device according to claim 1, wherein the writing operation further includes a verification operation and a program-after-verification operation that is performed when the verification operation indicates that the program operation has failed.

6. The nonvolatile semiconductor memory device according to claim 5, wherein the program voltage applied during the program-after-verification operation is larger than the program voltage applied during the program operation by a difference value and the difference value varies based on the determination result of the pre-programming verification operation.

7. The nonvolatile semiconductor memory device according to claim 1, wherein the writing operation performed on the memory cell in the erasure state is a lower page writing operation.

8. A nonvolatile semiconductor memory device comprising:
a memory cell array having nonvolatile memory cells in which one of multiple values is programmable therein by setting one of a plurality of threshold values therein; and
a control circuit configured to perform a writing operation on the memory cells of the memory cell array,
wherein the writing operation performed on a memory cell in an erasure state includes a pre-programming verification operation to determine a threshold level of the memory cell in the erasure state, a pre-program operation in which the threshold level of the memory cell in the erasure state is increased if the threshold level of the memory cell in the erasure state is below a reference level and is maintained if the threshold level of the memory cell in the erasure state is above the reference level, and a program operation.

9. The nonvolatile semiconductor memory device according to claim 8, wherein
the control circuit performs the pre-programming verification operation while loading data into the control circuit from an external device.

10. The nonvolatile semiconductor memory device according to claim 9, wherein
the control circuit includes a first latch circuit and a second latch circuit, and
the first latch circuit holds data read from the memory cell in the pre-programming verification operation, and the second latch circuit holds data which is loaded into the control circuit from the external device.

11. The nonvolatile semiconductor memory device according to claim 8, wherein
each memory cell is connected to between a word line and a bit line, and
the control circuit selects a voltage applied to a bit line connected to a memory cell based on a determination result of the pre-programming verification operation performed on the memory cell.

12. The nonvolatile semiconductor memory device according to claim 8, wherein the writing operation performed on the memory cell in the erasure state is a lower page writing operation.

13. A nonvolatile semiconductor memory device comprising:
a memory cell array having a plurality of bit lines and word lines and nonvolatile memory cells at intersections of the bit lines and word lines, each memory cell having one of a plurality of threshold values programmed therein; and
a control circuit configured to perform a writing operation on the memory cells of the memory cell array,
wherein the writing operation performed on a memory cell in an erasure state includes a pre-programming verification operation to determine a threshold level of the memory cell in the erasure state, and a program operation in which a bit line voltage for the memory cell is selected from a plurality of bit line voltages based on a determination result of the pre-programming verification operation, wherein
the control circuit selects a first bit line voltage to a memory cell which is determined to have a threshold level larger than a reference value in the pre-programming verification operation, and selects a second bit line voltage lower than the first bit line voltage to a memory cell which is determined to have a threshold level smaller than the reference value in the pre-programming verification operation.

14. The nonvolatile semiconductor memory device according to claim 13, wherein
the control circuit selects and writes a first program voltage to a memory cell which is determined to have a threshold level larger than the reference value in the pre-programming verification operation, and selects and writes a second program voltage lower than the first program voltage to a memory cell which is determined to have a threshold level smaller than the reference value in the pre-programming verification operation.

15. The nonvolatile semiconductor memory device according to claim 13, wherein
the control circuit performs the pre-programming verification operation while loading data into the control circuit from an external device.

16. The nonvolatile semiconductor memory device according to claim 13, wherein the writing operation performed on the memory cell in the erasure state is a lower page writing operation.

* * * * *